United States Patent
Cheong et al.

(10) Patent No.: US 12,149,094 B2
(45) Date of Patent: Nov. 19, 2024

(54) ADAPTIVE BOOSTING OF RECTIFIED VOLTAGE IN A WIRELESS CHARGING SYSTEM

(71) Applicant: STMicroelectronics Asia Pacific Pte Ltd, Singapore (SG)

(72) Inventors: Chee Weng Cheong, Singapore (SG); Kien Beng Tan, Singapore (SG)

(73) Assignee: STMicroelectronics Asia Pacific Pte Ltd, Singapore (SG)

( * ) Notice: Subject to any disclaimer, the term of this patent is extended or adjusted under 35 U.S.C. 154(b) by 604 days.

(21) Appl. No.: 17/490,437

(22) Filed: Sep. 30, 2021

(65) Prior Publication Data

US 2023/0099911 A1    Mar. 30, 2023

(51) Int. Cl.
| | | |
|---|---|---|
| H02J 3/32 | (2006.01) | |
| G01R 19/165 | (2006.01) | |
| H02J 7/04 | (2006.01) | |
| H02J 50/10 | (2016.01) | |
| H02J 50/90 | (2016.01) | |
| H02M 1/00 | (2006.01) | |
| H02M 3/156 | (2006.01) | |
| H02M 7/217 | (2006.01) | |

(Continued)

(52) U.S. Cl.
CPC ........ *H02J 50/10* (2016.02); *G01R 19/16538* (2013.01); *H02J 7/04* (2013.01); *H02J 50/90* (2016.02); *H02M 1/0003* (2021.05); *H02M 3/156* (2013.01); *H02M 7/219* (2013.01); *H03K 17/687* (2013.01)

(58) Field of Classification Search
CPC .... H02J 50/10; H02J 7/04; H02J 50/90; H02J 3/32; G01R 19/16538; H02M 1/0003; H02M 3/156; H02M 7/219; H02M 1/32; H02M 1/0045; H02M 7/06; H02M 3/33576; H02M 7/217; H03K 17/687
USPC .......................................................... 307/104
See application file for complete search history.

(56) References Cited

U.S. PATENT DOCUMENTS

2014/0117949 A1 *   5/2014   Sadwick .............. H02M 5/293
                                                                     323/239
2020/0186033 A1    6/2020   Lee

FOREIGN PATENT DOCUMENTS

KR    1020170047768 A    5/2017
WO    2006003460 A1      1/2006

OTHER PUBLICATIONS

EP Search Report for counterpart EP Appl. No. 22192216.4, report dated FEb. 20, 2023, 5 pgs.

* cited by examiner

*Primary Examiner* — Rexford N Barnie
*Assistant Examiner* — Xuan Ly
(74) *Attorney, Agent, or Firm* — Crowe & Dunlevy LLC

(57) ABSTRACT

A wireless power receiver includes a rectifier with first and second inputs coupled to first and second terminals of a receiver coil, and having a first output coupled to ground and a second output at which a rectified voltage is produced. A first switch is coupled between the second input and ground, and is controlled by a first gate voltage generated at a first node. A second switch is coupled between the first node and ground, and is controlled by a second gate voltage. The first gate voltage closes the first switch to couple the second input to ground when the rectified voltage is less than a threshold voltage, boosting the rectified voltage. The second gate voltage closes the second switch to cause the second gate (Continued)

voltage to be pulled to ground when the rectified voltage is greater than the threshold voltage, limiting the boosting of the rectified voltage.

17 Claims, 3 Drawing Sheets

(51) Int. Cl.
*H02M 7/219* (2006.01)
*H03K 17/687* (2006.01)

ADAPTIVE BOOSTING OF RECTIFIED VOLTAGE IN A WIRELESS CHARGING SYSTEM

TECHNICAL FIELD

This disclosure is related to the field of wireless charging and, in particular, to a technique for adaptively boosting the rectified voltage generated by a wireless receiver so that it is able to power up an internal voltage regulator even when the receiver and transmitter coils are not properly aligned.

BACKGROUND

Portable electronic devices, such as smartphones, smartwatches, audio output devices (earbuds, headphones), active styluses, and wearables operate on battery power, and not from wired power transmitted thereto over wired transmission lines and distribution systems. The batteries used for such devices are typically rechargeable and, therefore, a way to recharge the power of such batteries is necessary.

Most portable electronic devices include a charging port, typically conforming to the Micro USB or USB-C standards, into which a power cord connected to a power source can be inserted to provide for recharging of their batteries. However, such charging ports may make it difficult to enhance the water resistance of the electronic device, and are subject to damage from repeated use. In addition, some smaller portable electronic devices (for example, earbuds and smartwatches) may lack the available space to provide for a charging port. Still further, some users may find it cumbersome to plug a power cord into the charging port of an electronic device to charge the battery of that device.

Therefore, to address these issues, wireless power transmission has been developed. A typical wireless power transmission system 5 is shown in FIG. 1 and includes a transmitter 6 formed by a transmission coil Lp driven by time varying electric power from a power source 7 to form a time-varying electric field. The wireless power transmission system 5 includes a receiver 8 formed by a receiver coil Ls in which the time-varying electric field induces an AC current that is in turn rectified by a bridge formed by diodes D1-D4, said AC current charging a tank capacitor Ct to a rectified voltage Vrect. A low dropout amplifier (LDO) 16 generates a power signal from the rectified voltage Vrect, and uses the power signal to drive a load, such as the illustrated internal circuits 17.

An issue arises when the transmitter coil Lp and receiver coil Ls are not properly aligned, in which case the receiver 8 receives less power than it would if the coils were aligned. In fact, in this case, the receiver 8 may receive insufficient power for the rectified voltage Vrect to be sufficient for powering the LDO 16, meaning that the internal circuits 17 will not be properly powered or charged.

This limits the convenience of the wireless power transmission system 5, since there is very little spatial freedom in terms of the alignment between the device incorporating the transmitter 6 and the device incorporating the receiver 8. As such, further development is needed.

SUMMARY

Disclosed herein is a wireless power receiver, including: a receiver coil having first and second terminals; a bridge rectifier having first and second inputs coupled to the first and second terminals of the receiver coil, the bridge rectifier having a first output coupled to ground and a second output coupled to a rectified voltage node at which a rectified voltage is produced; a first transistor having a conduction path coupled between the second input of the bridge rectifier and ground, the first transistor controlled by a first gate voltage generated at a first node; a switch control circuit having an input coupled to the rectified voltage node and an output coupled to the first node, the switch control circuit generating the first gate voltage at the first node as a function of the rectified voltage; a second transistor having a conduction path coupled between the first node and ground, the second transistor controlled by a second gate voltage; a rectified voltage detection circuit having an input coupled to the rectified voltage node and an output at which the second gate voltage is generated, the rectified voltage detection circuit generating the second gate voltage as a function of the rectified voltage; wherein the switch control circuit is configured to generate the first gate voltage such that it turns on the first transistor to thereby boost the rectified voltage, in response to the rectified voltage becoming greater than a turn-on voltage; and wherein the rectified voltage detection circuit is configured to, in response to the rectified voltage exceeding a lower threshold voltage greater than the turn-on voltage, generate the second gate voltage such that it increases conductivity of the second transistor as the rectified voltage increases, the increase in the conductivity of the second transistor serving to lower the first gate voltage to thereby decrease conductivity of the first transistor and prevent the rectified voltage from exceeding an upper threshold voltage.

The switch control circuit may include: a first resistor coupled between the rectified voltage node and the first node; and a first capacitor coupled between the first node and ground; wherein the first gate voltage is produced at the first node. The rectified voltage detection circuit may include: a second resistor coupled between the rectified voltage node and a second node; and a third resistor coupled between the second node and ground; wherein the second gate voltage is produced at the second node.

As the bridge rectifier begins to source current to the rectified voltage node, the first capacitor may be charged such that when the rectified voltage exceeds the turn-on voltage, the first gate voltage turns on the first transistor to thereby couple the second input of the bridge rectifier to ground, boosting the rectified voltage.

As the rectified voltage increases, the second gate voltage may increase, in turn increasing the conductivity of the second transistor, in turn lowering the first gate voltage and decreasing the conductivity of the first transistor.

A low dropout amplifier may be coupled to receive the rectified voltage.

Also disclosed herein is a wireless power receiver, including: a receiver coil having first and second terminals; a bridge rectifier having first and second inputs coupled to the first and second terminals of the receiver coil, the bridge rectifier having a first output coupled to ground and a second output coupled to a rectified voltage node at which a rectified voltage is produced; a first switch coupled between the second input of the bridge rectifier and ground, the first switch controlled by a first gate voltage generated at a first node; and a second switch coupled between the first node and ground, the second switch controlled by a second gate voltage; wherein the first gate voltage closes the first switch to thereby couple the second input of the bridge rectifier to ground when the rectified voltage is less than a threshold voltage, boosting the rectified voltage; and wherein the second gate voltage closes the second switch to thereby cause the second gate voltage to be pulled to ground when the rectified voltage is greater than the threshold voltage, limiting the boosting of the rectified voltage.

A switch control circuit may have an input coupled to the rectified voltage node and an output coupled to the first node, and a rectified voltage detection circuit may have an input coupled to the rectified voltage node and an output at which the second gate voltage is generated.

The switch control circuit may include: a first resistor coupled between the rectified voltage node and the first node; and a first capacitor coupled between the first node and ground; wherein the first gate voltage is produced at the first node.

The first switch may be a first transistor having a first conduction terminal coupled to the second input of the bridge rectifier, a second conduction terminal coupled to ground, and a control terminal coupled to the first node.

The rectified voltage detection circuit may include: a second resistor coupled between the rectified voltage node and a second node; and a third resistor coupled between the second node and ground; wherein the second gate voltage is produced at the second node.

The second switch may be a second transistor having a first conduction terminal coupled to the first node, a second conduction terminal coupled to ground, and a control terminal coupled to the second node.

Also disclosed herein is a method of operating a wireless power receiver, including: receiving a time-varying electric field at a receiver coil such that alternating current is induced in the receiver coil; rectifying the alternating current using a bridge rectifier coupled between first and second terminals of the receiver coil to thereby produce a rectified voltage; when the rectified voltage exceeds a turn-on voltage, turning on a switch element coupled between the second terminal of the receiver coil and ground to thereby boost the rectified voltage; and when the rectified voltage exceeds a lower threshold voltage, increasing conductivity of a capacitive discharge device coupled to a control terminal of the switch element, thereby decreasing conductivity of the switch element, such that the rectified voltage does not exceed an upper threshold voltage.

The method may include powering a regulator using the rectified voltage.

The method may include generating an output voltage from the rectified voltage using the regulator, and powering a load using the output voltage.

Turning on the switch element may include turning on a first transistor, and wherein increasing the conductivity of the capacitive discharge device may include increasing the conductivity of a second transistor.

Also disclosed herein is a wireless power transmission system, including: a transmitter including a transmitter coil; a receiver coil having first and second terminals; a bridge rectifier having first and second inputs coupled to the first and second terminals of the receiver coil, the bridge rectifier having a first output coupled to ground and a second output coupled to a rectified voltage node at which a rectified voltage is produced; a first transistor coupled between the second input of the bridge rectifier and ground, the first transistor controlled by a first gate voltage generated at a first node; a second transistor coupled between the first node and ground, the second transistor controlled by a second gate voltage; a switch control circuit comprising a first resistor coupled between the rectified voltage node and the first node, and a first capacitor coupled between the first node and ground, wherein the first gate voltage is produced at the first node; and a rectified voltage detection circuit comprising a second resistor coupled between the rectified voltage node and a second node, and a third resistor coupled between the second node and ground, wherein the second gate voltage is produced at the second node.

The first transistor may be a first n-channel transistor with its drain coupled to the second input of the bridge rectifier, its source coupled to ground, and its gate coupled to the first node.

The second transistor may be a second n-channel transistor with its drain coupled to the first node, its source coupled to ground, and its gate coupled to the second node.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead.

Figure 1:
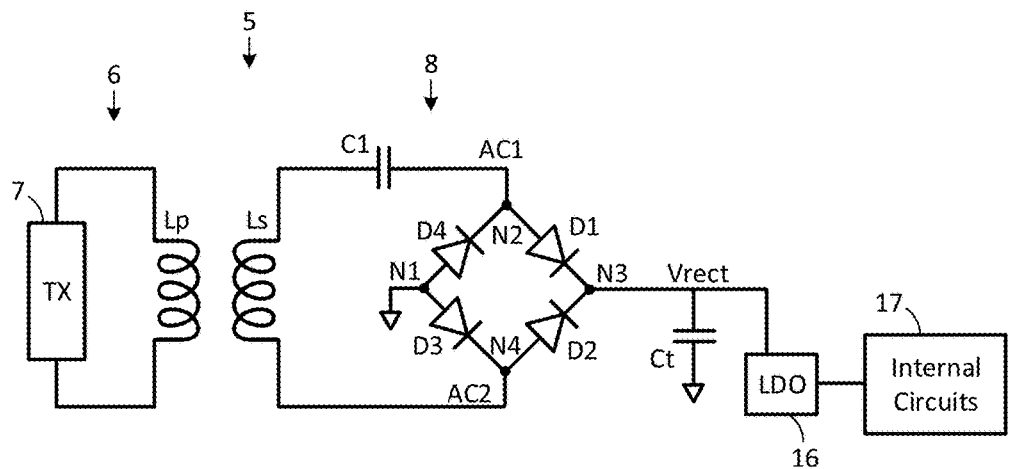
FIG. 1 is a schematic block diagram of a prior art wireless power transmission system.
Figure 2:
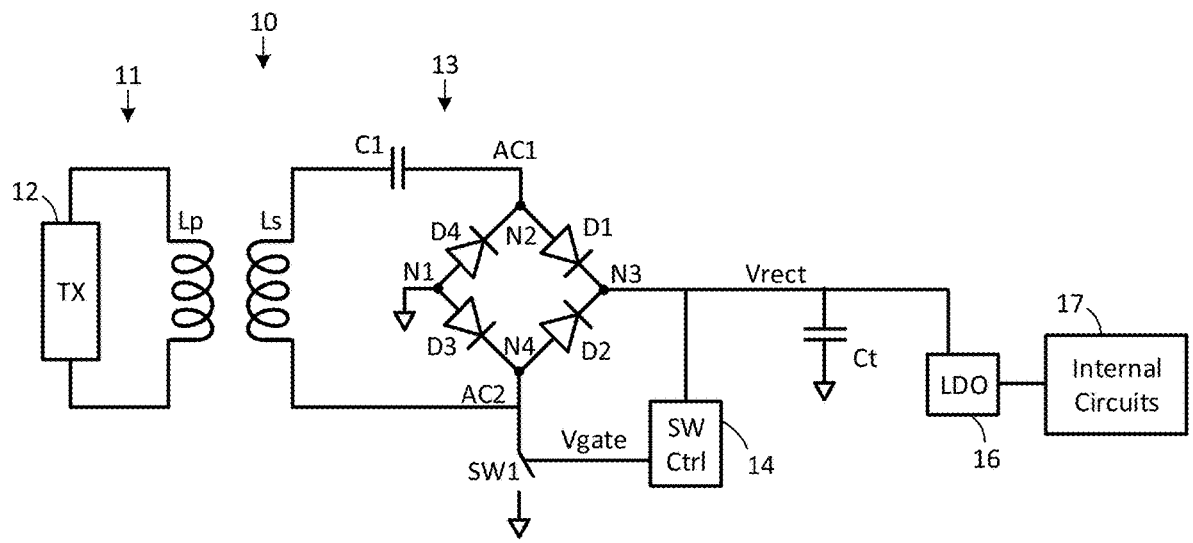
FIG. 2 is a schematic block diagram of a first wireless power transmission system disclosed herein.

Now described with reference to FIG. 2 is a first wireless power transmission system 10 capable of boosting the rectified voltage Vrect so as ameliorate the issues caused by imperfect alignment between the transmitter and receiver. The wireless power transmission system 10 includes a transmitter 11 formed by a transmission coil Lp driven by time varying electric power from a power source 12 to form a time-varying electric field. The wireless power transmission system 10 includes a receiver 13 formed by a receiver coil Ls in which the time-varying electric field induces an AC current that is in turn rectified by a bridge formed by diodes D1-D4, said AC current charging a tank capacitor Ct to a rectified voltage Vrect. A low dropout amplifier (LDO) 16 generates a power signal from the rectified voltage Vrect, and uses the power signal to drive a load, such as the illustrated internal circuits 17.

As stated, a rectifying bridge is formed by diodes D1-D4. In particular, the bridge is formed by: diode D1 having its anode coupled to node N2 and its cathode coupled to node N3; diode D2 having its anode coupled to node N4 and its cathode coupled to node N3; diode D3 having its anode coupled to node N1 and its cathode coupled to node N4; and diode D4 having its anode coupled to node N1 and its cathode coupled to node N2. Node N1 is grounded, node N2 is coupled to a first terminal of Ls through a capacitance C1, and node N4 is coupled to a second terminal of Ls. In addition, node N4 is selectively coupled to ground by a switch SW1. A switch control circuit 14 controls the switch SW1. An AC signal induced in the coil Ls is represented by signals AC1 at node N2 and AC2 at node N4.

When the switch control circuit 14 closes the switch SW1, the effect is to couple node N4 (and therefore AC2) to ground. As a result, the rectified voltage Vrect formed on the tank capacitor Ct increases. This thereby allows the first wireless power transmission system 10 to be used in applications in which the transmitter 11 and receiver 13 may be poorly aligned, as the increased rectified voltage Vrect is more likely to be capable of powering the LDO 16.

While this does achieve the goal of powering the LDO 16 even when the transmitter 11 and receiver 13 are poorly aligned, it does carry a drawback—if the transmitter 11 and receiver 13 are well aligned, the rectified voltage Vrect may be boosted to an undesirably high level, which may be outside the safe operating range of the LDO 16 and therefore damage the device.

As such, an additional embodiment has been developed.

Figure 3:
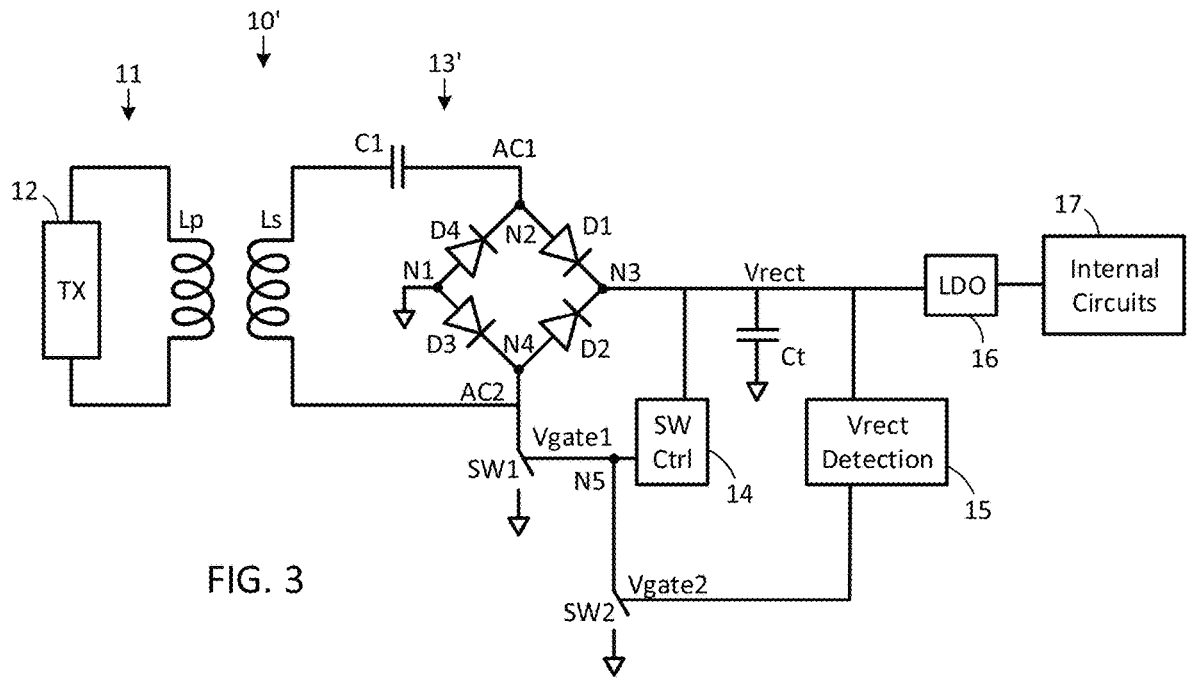
FIG. 3 is a schematic block diagram of a second wireless power transmission system disclosed herein.

Now described with reference to FIG. 3 is a second wireless power transmission system 10' capable of boosting the rectified voltage Vrect so as ameliorate the issues caused by imperfect alignment between the transmitter and receiver. The wireless power transmission system 10' includes a transmitter 11 formed by a transmission coil Lp driven by time varying electric power from a power source 12 to form a time-varying electric field. The wireless power transmission system 10' includes a receiver 13' formed by a receiver coil Ls in which the time-varying electric field induces an AC current that is in turn rectified by a bridge formed by diodes D1-D4, said AC current charging a tank capacitor Ct to a rectified voltage Vrect. A low dropout amplifier (LDO) 16 generates a power signal from the rectified voltage Vrect, and uses the power signal to drive a load, such as the illustrated internal circuits 17.

As stated, a rectifying bridge is formed by diodes D1-D4. In particular, the bridge is formed by: diode D1 having its anode coupled to node N2 and its cathode coupled to node N3; diode D2 having its anode coupled to node N4 and its cathode coupled to node N3; diode D3 having its anode coupled to node N1 and its cathode coupled to node N4; and diode D4 having its anode coupled to node N1 and its cathode coupled to node N2. Node N1 is grounded, node N2 is coupled to a first terminal of Ls through a capacitance C1, and node N4 is coupled to a second terminal of Ls.

In addition, node N4 is selectively coupled to ground through switch SW1 under control of a gate signal Vgate1. A switch control circuit 14 is coupled to note N3 to detect the rectified voltage Vrect, and generates the gate signal Vgate1 to node N5 based upon the detected rectified voltage Vrect. A switch SW2 selectively couples node N5 to ground under control of a gate signal Vgate2. A rectified voltage detection circuit 15 is coupled to node N3 to detect the rectified voltage Vrect, and generates the gate signal Vgate2 for use in controlling the switch SW2.

In operation, when the rectified voltage Vrect is greater than a turn-on voltage, the switch control circuit 14 asserts the gate signal Vgate1 to close the switch SW1, thereby shorting node N4 to ground, providing a large boost to the rectified voltage Vrect. When the rectified voltage Vrect rises above a threshold voltage greater than the turn-on voltage, the rectified voltage detection circuit 15 asserts the gate signal Vgate2 to thereby close switch SW2 and short node N5 to ground, which in turn pulls the gate signal Vgate1 to ground, opening the switch SW1.

Figure 4:
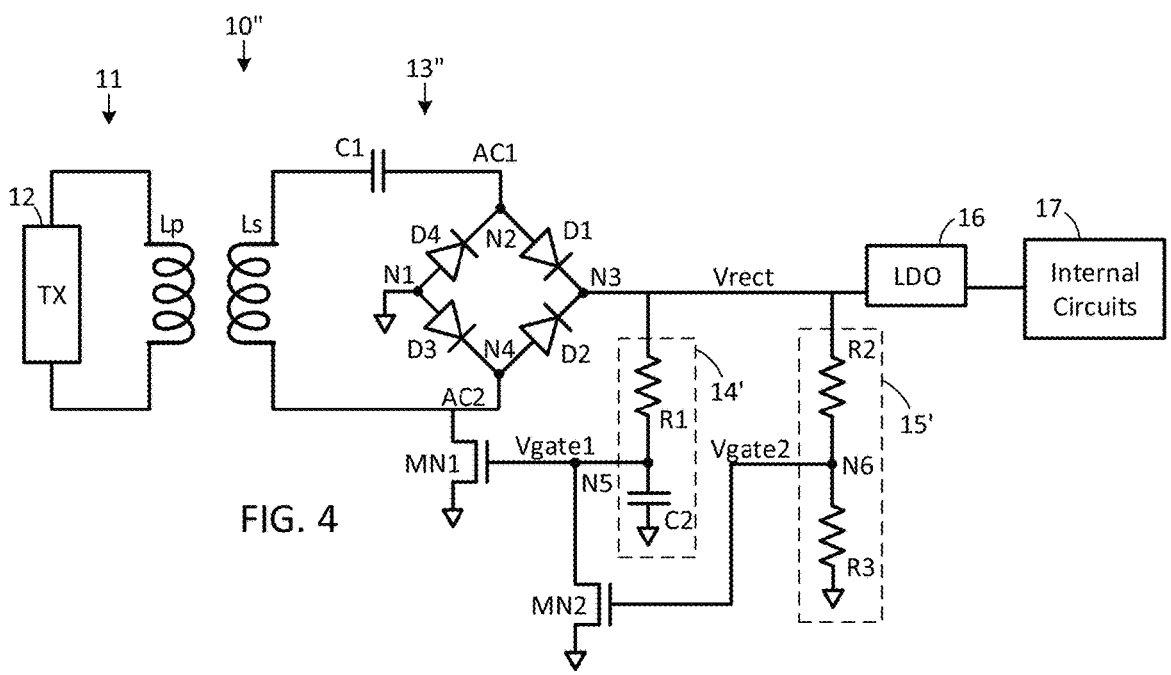
FIG. 4 is a more detailed schematic block diagram of the wireless power transmission system of FIG. 3.
Figure 5:
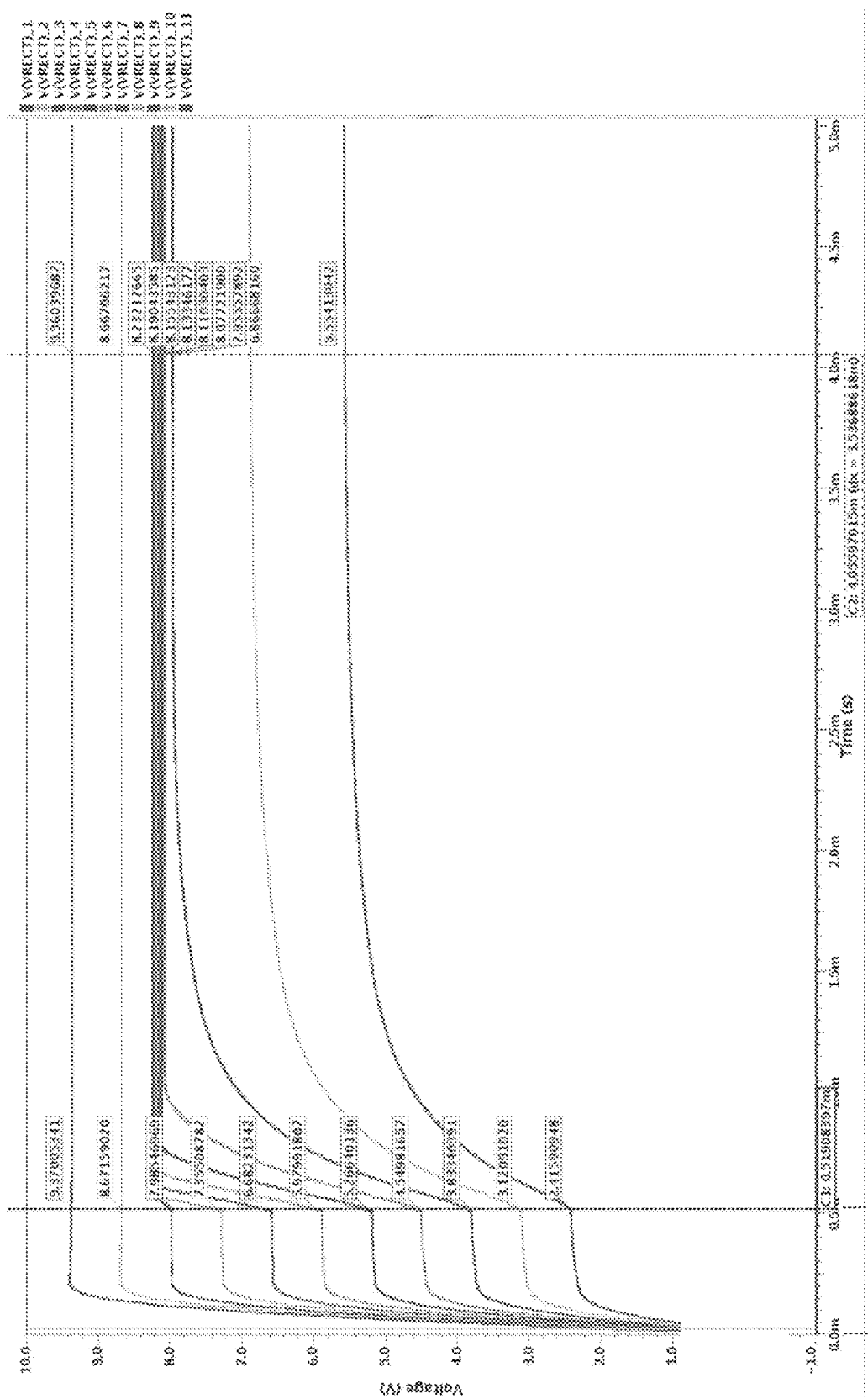
FIG. 5 is a graph showing operation of the wireless power transmission system of FIG. 4 when generating the rectified voltage in different operating conditions.

A more detailed embodiment of wireless power transmission system 10" is shown in FIG. 4, where it can be observed that the switch control circuit 14' is formed of a resistor R1 coupled between node N3 and node N5, and a capacitor C2 coupled between node N5 and ground. It is also to be observed that the rectified voltage detection circuit 15' is formed of a resistor R2 coupled between nodes N3 and N6, and a resistor R3 coupled between node N6 and ground. Also here, switch SW1 is an n-channel transistor MN1 having a drain coupled to node N4, a source coupled to ground, and a gate coupled to node N5 to receive the first gate signal Vgate1, and switch SW2 is an n-channel transistor MN2 having a drain coupled to node N5, a source coupled to ground, and a gate coupled to node N6 to receive the second gate signal Vgate2.

The analog arrangement of the switch control circuit 14' and rectified voltage detection circuit 15' enable a smooth modulation of the transistor MN1 so as to boost the rectified voltage Vrect while ensuring that Vrect is not boosted at a level that would be dangerous to the LDO 16. In operation, at startup, capacitor C2 begins to charge from the current sourced to node N3 by the bridge, quickly charging Vgate1 sufficiently high to turn on transistor MN1 fully into the saturation region, which in turn further boosts the rectified voltage Vrect by decreasing the impedance between AC2 and ground. As the rectified voltage Vrect increases, Vgate2 begins to increase, causing transistor MN2 to increase its conductance begin to discharge capacitor C2 to ground, in turn lowering the voltage Vgate1. Therefore, after the initial quick rise of Vgate1, Vgate1 begins to decrease as Vgate2 rises, causing the transistor MN2 to increase its conductance and increasingly discharge more charge from capacitor C2 to ground until a steady state is reached at which the rectified voltage Vrect is higher than it would be without the functionality provided by the switch control circuit 14', but is limited to a safe level by the rectified voltage detection circuit 15'. Through selection of the resistance of the resistors R2 and R3, the rate at which Vgate1 is decreased can be selected and the system 10" can be tuned.

A graph showing different VRECT voltages with different couplings, where a poor coupling yields a lower VRECT voltage. The time between T0 and T1 represents a conventional system, where VRECT is only dependent upon on coil coupling. After T1, the operation of the device of this disclosure has been added. With poor coupling where VRECT=2.4V, the device of this disclosure boosts VRECT to 5.55V. With a normal coupling, the device of this disclosure modulates VRECT to 8.2V. With a very good coupling where VRECT>8.2V, the device of this disclosure does not boost VRECT further higher (which may damage the device). Stated differently, observe that at time T0, the wireless power transmission system 10' is activated, with the transmitter 11 beginning to transmit power and the receiver 13" beginning to receiver power. Observe that between times T0 and T1, the rectified voltage Vrect builds to a generally steady state level, but after T1, the rectified voltage Vrect quickly increases to a new, higher, steady state level. This operation occurs because at time T1, Vrect has become sufficient for Vgate1 to turn on transistor MN1 (and thus the device of this disclosure has been activated). The graph of Vrect over time remains smooth because of the gradual increase in conductivity of the transistor MN2 as the Vgate2 increases (as a result of Vrect increasing).

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A wireless power receiver, comprising:
a receiver coil having first and second terminals;
a bridge rectifier having first and second inputs coupled to the first and second terminals of the receiver coil, the bridge rectifier having a first output coupled to ground and a second output coupled to a rectified voltage node at which a rectified voltage is produced;
a first transistor having a conduction path coupled between the second input of the bridge rectifier and ground, the first transistor controlled by a first gate voltage generated at a first node;
a switch control circuit having an input coupled to the rectified voltage node and an output coupled to the first node, the switch control circuit generating the first gate voltage at the first node as a function of the rectified voltage;
a second transistor having a conduction path coupled between the first node and ground, the second transistor controlled by a second gate voltage; and
a rectified voltage detection circuit having an input coupled to the rectified voltage node and an output at which the second gate voltage is generated, the rectified voltage detection circuit generating the second gate voltage as a function of the rectified voltage;
wherein the switch control circuit is configured to generate the first gate voltage such that it turns on the first transistor to thereby boost the rectified voltage, in response to the rectified voltage becoming greater than a turn-on voltage; and
wherein the rectified voltage detection circuit is configured to, in response to the rectified voltage exceeding a lower threshold voltage greater than the turn-on voltage, generate the second gate voltage such that it increases conductivity of the second transistor as the rectified voltage increases, the increase in the conductivity of the second transistor serving to lower the first gate voltage to thereby decrease conductivity of the first transistor and prevent the rectified voltage from exceeding an upper threshold voltage.

2. The wireless power receiver of claim 1,
wherein the switch control circuit comprises:
a first resistor coupled between the rectified voltage node and the first node; and
a first capacitor coupled between the first node and ground;
wherein the first gate voltage is produced at the first node; and
wherein the rectified voltage detection circuit comprises:
a second resistor coupled between the rectified voltage node and a second node; and
a third resistor coupled between the second node and ground;
wherein the second gate voltage is produced at the second node.

3. The wireless power receiver of claim 2, wherein, as the bridge rectifier begins to source current to the rectified voltage node, the first capacitor is charged such that when the rectified voltage exceeds the turn-on voltage, the first gate voltage turns on the first transistor to thereby couple the second input of the bridge rectifier to ground, boosting the rectified voltage.

4. The wireless power receiver of claim 3, wherein, as the rectified voltage increases, the second gate voltage increases, in turn increasing the conductivity of the second transistor, in turn lowering the first gate voltage and decreasing the conductivity of the first transistor.

5. The wireless power receiver of claim 1, further comprising a low dropout amplifier coupled to receive the rectified voltage.

6. A wireless power receiver, comprising:
a receiver coil having first and second terminals;
a bridge rectifier having first and second inputs coupled to the first and second terminals of the receiver coil, the bridge rectifier having a first output coupled to ground and a second output coupled to a rectified voltage node at which a rectified voltage is produced;
a first switch coupled between the second input of the bridge rectifier and ground, the first switch controlled by a first gate voltage generated at a first node; and
a second switch coupled between the first node and ground, the second switch controlled by a second gate voltage;
wherein the first gate voltage closes the first switch to thereby couple the second input of the bridge rectifier to ground when the rectified voltage is less than a threshold voltage, boosting the rectified voltage; and
wherein the second gate voltage closes the second switch to thereby cause the second gate voltage to be pulled to ground when the rectified voltage is greater than the threshold voltage, limiting the boosting of the rectified voltage.

7. The wireless power receiver of claim 6, further comprising a switch control circuit having an input coupled to the rectified voltage node and an output coupled to the first node, and a rectified voltage detection circuit having an input coupled to the rectified voltage node and an output at which the second gate voltage is generated.

8. The wireless power receiver of claim 7, wherein the switch control circuit comprises:
a first resistor coupled between the rectified voltage node and the first node; and
a first capacitor coupled between the first node and ground;
wherein the first gate voltage is produced at the first node.

9. The wireless power receiver of claim 8, wherein the first switch comprises a first transistor having a first conduction terminal coupled to the second input of the bridge rectifier, a second conduction terminal coupled to ground, and a control terminal coupled to the first node.

10. The wireless power receiver of claim 7, wherein the rectified voltage detection circuit comprises:
a second resistor coupled between the rectified voltage node and a second node; and
a third resistor coupled between the second node and ground;
wherein the second gate voltage is produced at the second node.

11. The wireless power receiver of claim 10, wherein the second switch comprises a second transistor having a first conduction terminal coupled to the first node, a second conduction terminal coupled to ground, and a control terminal coupled to the second node.

12. A method of operating a wireless power receiver, comprising:

receiving a time-varying electric field at a receiver coil such that alternating current is induced in the receiver coil; and rectifying the alternating current using a bridge rectifier coupled between first and second terminals of the receiver coil to thereby produce a rectified voltage;

when the rectified voltage exceeds a turn-on voltage, turning on a first transistor coupled between the second terminal of the receiver coil and ground to thereby boost the rectified voltage; and when the rectified voltage exceeds a lower threshold voltage, increasing conductivity of a second transistor coupled to a control terminal of the first transistor, thereby decreasing conductivity of the first transistor, such that the rectified voltage does not exceed an upper threshold voltage.

13. The method of claim 12, further comprising powering a regulator using the rectified voltage.

14. The method of claim 13, further comprising generating an output voltage from the rectified voltage using the regulator, and powering a load using the output voltage.

15. A wireless power transmission system, comprising:
a transmitter including a transmitter coil;
a receiver coil having first and second terminals;
a bridge rectifier having first and second inputs coupled to the first and second terminals of the receiver coil, the bridge rectifier having a first output coupled to ground and a second output coupled to a rectified voltage node at which a rectified voltage is produced;
a first transistor coupled between the second input of the bridge rectifier and ground, the first transistor controlled by a first gate voltage generated at a first node;
a second transistor coupled between the first node and ground, the second transistor controlled by a second gate voltage;
a switch control circuit comprising a first resistor coupled between the rectified voltage node and the first node, and a first capacitor coupled between the first node and ground, wherein the first gate voltage is produced at the first node; and
a rectified voltage detection circuit comprising a second resistor coupled between the rectified voltage node and a second node, and a third resistor coupled between the second node and ground, wherein the second gate voltage is produced at the second node.

16. The wireless power transmission system of claim 15, wherein the first transistor comprises a first n-channel transistor with its drain coupled to the second input of the bridge rectifier, its source coupled to ground, and its gate coupled to the first node.

17. The wireless power transmission system of claim 16, wherein the second transistor comprises a second n-channel transistor with its drain coupled to the first node, its source coupled to ground, and its gate coupled to the second node.

* * * * *